(12) United States Patent
Goto et al.

(10) Patent No.: US 11,362,261 B2
(45) Date of Patent: Jun. 14, 2022

(54) MULTI-LAYER PIEZOELECTRIC CERAMIC COMPONENT AND PIEZOELECTRIC DEVICE

(71) Applicant: TAIYO YUDEN CO., LTD., Tokyo (JP)

(72) Inventors: Takayuki Goto, Takasaki (JP); Hiroyuki Shimizu, Takasaki (JP); Sumiaki Kishimoto, Takasaki (JP); Yukihiro Konishi, Takasaki (JP)

(73) Assignee: TAIYO YUDEN CO., LTD, Tokyo (JP)

( * ) Notice: Subject to any disclaimer, the term of this patent is extended or adjusted under 35 U.S.C. 154(b) by 686 days.

(21) Appl. No.: 16/258,376

(22) Filed: Jan. 25, 2019

(65) Prior Publication Data

US 2019/0237656 A1    Aug. 1, 2019

(30) Foreign Application Priority Data

Jan. 30, 2018  (JP) .............................. JP2018-013962

(51) Int. Cl.
| | |
|---|---|
| *H01L 41/083* | (2006.01) |
| *H01L 41/187* | (2006.01) |
| *H01L 41/09* | (2006.01) |
| *H01L 41/047* | (2006.01) |

(Continued)

(52) U.S. Cl.
CPC ........ *H01L 41/187* (2013.01); *H01L 41/0471* (2013.01); *H01L 41/0472* (2013.01); *H01L 41/0533* (2013.01); *H01L 41/083* (2013.01); *H01L 41/09* (2013.01); *H01L 41/338* (2013.01)

(58) Field of Classification Search
CPC ..... H01L 41/083; H01L 41/187; H01L 41/09; H01L 41/0471
See application file for complete search history.

(56) References Cited

U.S. PATENT DOCUMENTS 5,233,256 A * 8/1993 Hayashi ................ H01L 41/083
                                                                310/317
6,731,050 B2 * 5/2004 Bindig ................ H01L 41/0838
                                                                29/25.35

(Continued)

FOREIGN PATENT DOCUMENTS

JP          61239682 A   * 10/1986  ......... H01L 41/0472
WO     2013051328 A1    4/2013

*Primary Examiner* — J. San Martin
(74) *Attorney, Agent, or Firm* — Law Office of Katsuhiro Arai

(57) ABSTRACT

A multi-layer piezoelectric ceramic component includes: a piezoelectric ceramic body having a cuboid shape having upper and lower surfaces facing in a thickness direction, first and second end surfaces facing in a length direction, and a pair of side surfaces facing in a width direction; first internal electrodes formed in the piezoelectric ceramic body and drawn to the first end surface; second internal electrodes formed in the piezoelectric ceramic body and drawn to the second end surface; a first terminal electrode formed on the first end surface; and a second terminal electrode formed on the second end surface, the first and second internal electrodes each having a width equal to a distance between the pair of side surfaces, at least one of the pair of side surfaces including a groove extending in non-parallel with the length direction.

4 Claims, 13 Drawing Sheets

(51) Int. Cl.
*H01L 41/338* (2013.01)
*H01L 41/053* (2006.01)

(56) References Cited

U.S. PATENT DOCUMENTS

| | | | |
|---|---|---|---|
| 2007/0080612 A1* | 4/2007 | Terazono | F02M 51/0603 |
| | | | 310/366 |
| 2007/0269667 A1* | 11/2007 | Kobayashi | H01L 41/0838 |
| | | | 428/469 |
| 2013/0241352 A1 | 9/2013 | Hayashi et al. | |

* cited by examiner

MULTI-LAYER PIEZOELECTRIC CERAMIC COMPONENT AND PIEZOELECTRIC DEVICE

CROSS REFERENCE TO RELATED APPLICATIONS

This application claims the benefit of Japanese Priority Patent Application JP 2018-013962 filed Jan. 30, 2018, the entire contents of which are incorporated herein by reference.

BACKGROUND

The present disclosure relates to a multi-layer piezoelectric ceramic component usable as a piezoelectric actuator and to a piezoelectric device.

A piezoelectric actuator is an actuator that includes a piezoelectric element including a piezoelectric material and an electrode, and uses deformation that is caused in the piezoelectric material by an inverse piezoelectric effect when a voltage is applied to the electrode. The piezoelectric actuator includes a bimorph piezoelectric actuator that includes two piezoelectric actuators.

A general bimorph piezoelectric actuator has a structure in which the piezoelectric actuators are attached to both surfaces of a metal plate, and one of the piezoelectric actuators is expanded and the other one of the piezoelectric actuators is contracted, to enable the whole of the actuator to be largely deformed. Further, in the bimorph piezoelectric actuator, a piezoelectric actuator having an element bimorph structure in which two piezoelectric actuators are integrated is developed (for example, WO 2013/051328).

SUMMARY

From the viewpoint of insulation properties and moisture resistance, an insulating film may be provided to a surface of the element as described above in a later step. In this case, how to improve adhesion properties of the insulating film, in order to maintain insulation properties and moisture resistance, is important.

In view of the circumstances as described above, it is desirable to provide a multi-layer piezoelectric ceramic component and a piezoelectric device, in which adhesion properties of an insulating film formed on a surface of an element are improved.

According to an embodiment of the present disclosure, there is provided a multi-layer piezoelectric ceramic component including a piezoelectric ceramic body, first internal electrodes, second internal electrodes, a first terminal electrode, and a second terminal electrode.

The piezoelectric ceramic body has a cuboid shape having an upper surface and a lower surface facing each other in a thickness direction, a first end surface and a second end surface facing each other in a length direction, and a pair of side surfaces facing each other in a width direction.

The first internal electrodes are formed in the piezoelectric ceramic body, and are drawn to the first end surface.

The second internal electrodes are formed in the piezoelectric ceramic body, and are drawn to the second end surface, the second internal electrodes being laminated alternately with the first internal electrodes at predetermined distances from the respective first internal electrodes in the thickness direction.

The first terminal electrode is formed on the first end surface, and is electrically connected to the first internal electrodes.

The second terminal electrode is formed on the second end surface, and is electrically connected to the second internal electrodes.

The first internal electrodes and the second internal electrodes each have a width equal to a distance between the pair of side surfaces, and at least one of the pair of side surfaces includes a groove extending in non-parallel with the length direction.

With such a configuration, when a voltage is applied between the first internal electrodes and the second internal electrodes, the piezoelectric ceramic body can be deformed. Further, since at least one of the pair of side surfaces includes a groove extending in non-parallel with the length direction, if an insulating film is formed on the side surface, adhesion properties of the insulating film are improved by an anchoring effect. Moreover, the first internal electrodes and the second internal electrodes each have a width equal to the width of the piezoelectric ceramic body, and restraint by the piezoelectric ceramic body (side margins) covering the side surfaces of those internal electrodes disappears, which makes it possible to prevent reduction in displacement performance.

The multi-layer piezoelectric ceramic component may further include third internal electrodes and a third terminal electrode.

The third internal electrodes may be formed in the piezoelectric ceramic body, and are drawn to a position of the first end surface, the position being different from a position to which the first internal electrodes are drawn, the third internal electrodes being laminated alternately with the second internal electrodes at predetermined distances from the respective second internal electrodes in the thickness direction.

The third terminal electrode may be electrically connected to the third internal electrodes at a position of the first end surface, the position being different from the position to which the first internal electrodes are drawn.

The third internal electrodes may each have a width equal to a distance between the pair of side surfaces.

In the multi-layer piezoelectric ceramic component, the pair of side surfaces may be covered with an insulating film made of an insulator different from the piezoelectric ceramic body.

In the multi-layer piezoelectric ceramic component, the piezoelectric ceramic body may have a relationship in which a length is larger than a width and the width is larger than a thickness.

According to another embodiment of the present disclosure, there is provided a piezoelectric device including a vibration member and a multi-layer piezoelectric ceramic component mounted to the vibration member.

The multi-layer piezoelectric ceramic component includes a piezoelectric ceramic body, first internal electrodes, second internal electrodes, a first terminal electrode, and a second terminal electrode.

The piezoelectric ceramic body has a cuboid shape having an upper surface and a lower surface facing each other in a thickness direction, a first end surface and a second end surface facing each other in a length direction, and a pair of side surfaces facing each other in a width direction.

The first internal electrodes are formed in the piezoelectric ceramic body, and are drawn to the first end surface.

The second internal electrodes are formed in the piezoelectric ceramic body and are drawn to the second end surface, the second internal electrodes being laminated alternately with the first internal electrodes at predetermined distances from the respective first internal electrodes in the thickness direction.

The first terminal electrode is formed on the first end surface, and is electrically connected to the first internal electrodes.

The second terminal electrode is formed on the second end surface, and is electrically connected to the second internal electrodes.

The first internal electrodes and the second internal electrodes each have a width equal to a distance between the pair of side surfaces, and at least one of the pair of side surfaces includes a groove extending in non-parallel with the length direction.

With such a configuration, a piezoelectric device including the multi-layer piezoelectric ceramic component described above is provided.

As described above, according to the present disclosure, it is possible to provide a multi-layer piezoelectric ceramic component and a piezoelectric device, in which adhesion properties of an insulating film formed on a surface of an element are improved.

These and other objects, features, and advantages of the present disclosure will become more apparent in light of the following detailed description of embodiments thereof, as illustrated in the accompanying drawings.

BRIEF DESCRIPTION OF DRAWINGS

FIG. 3 is a plan view of a first side surface 101a;

FIG. 12B is a view of a part of a cut surface taken along the line D-D of FIG. 12A;

FIG. 12C is a view showing an example in which an insulating film 112 is formed on the first side surface 101a;

DETAILED DESCRIPTION OF EMBODIMENTS

Hereinafter, an embodiment of the present disclosure will be described with reference to the drawings. In each figure, an X-Y-Z coordinate system is used in some cases.

Configuration of Multi-layer Piezoelectric Ceramic Component

Figure 1:
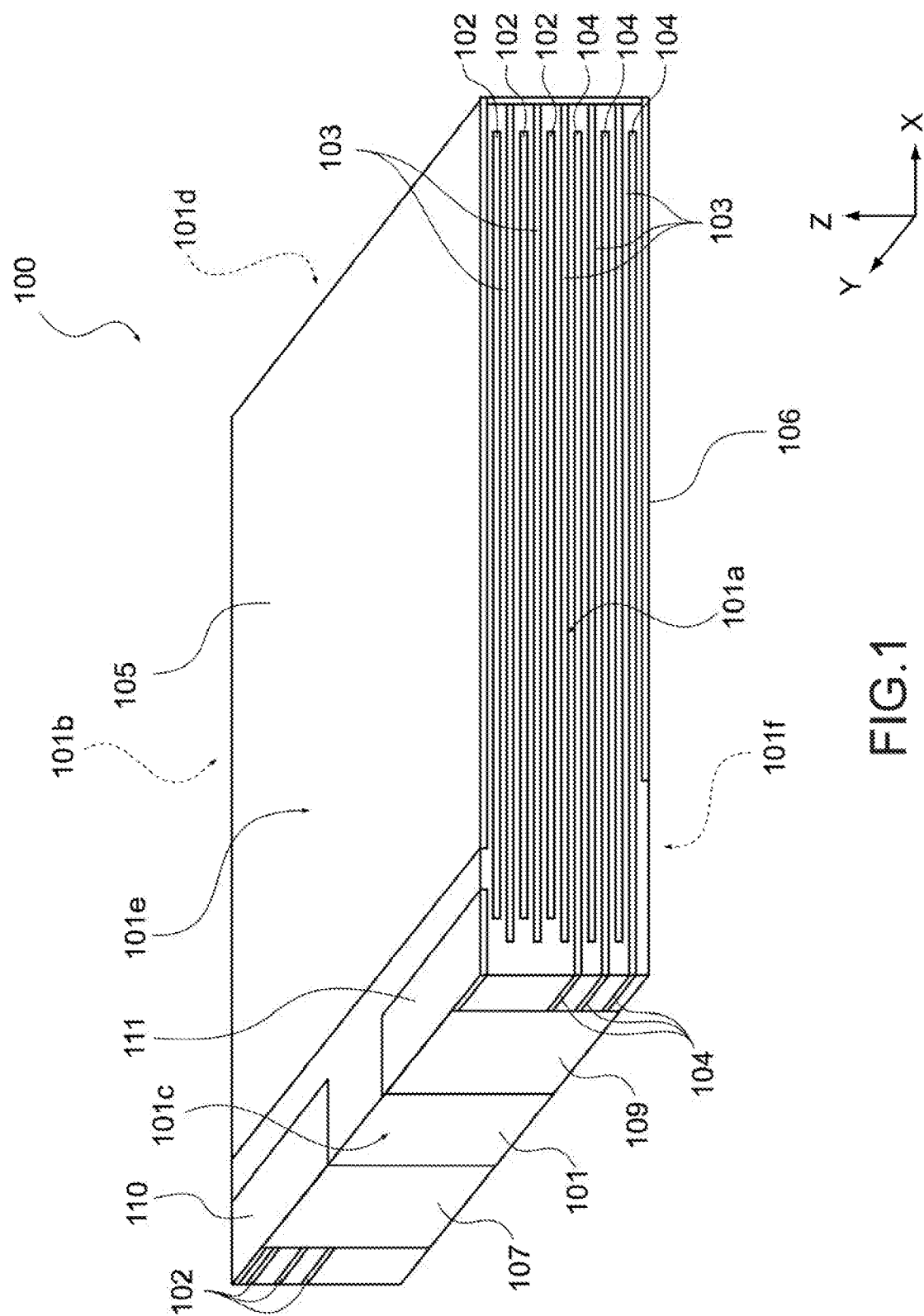
FIG. 1 is a perspective view of a multi-layer piezoelectric ceramic component 100 according to an embodiment.
Figure 2:
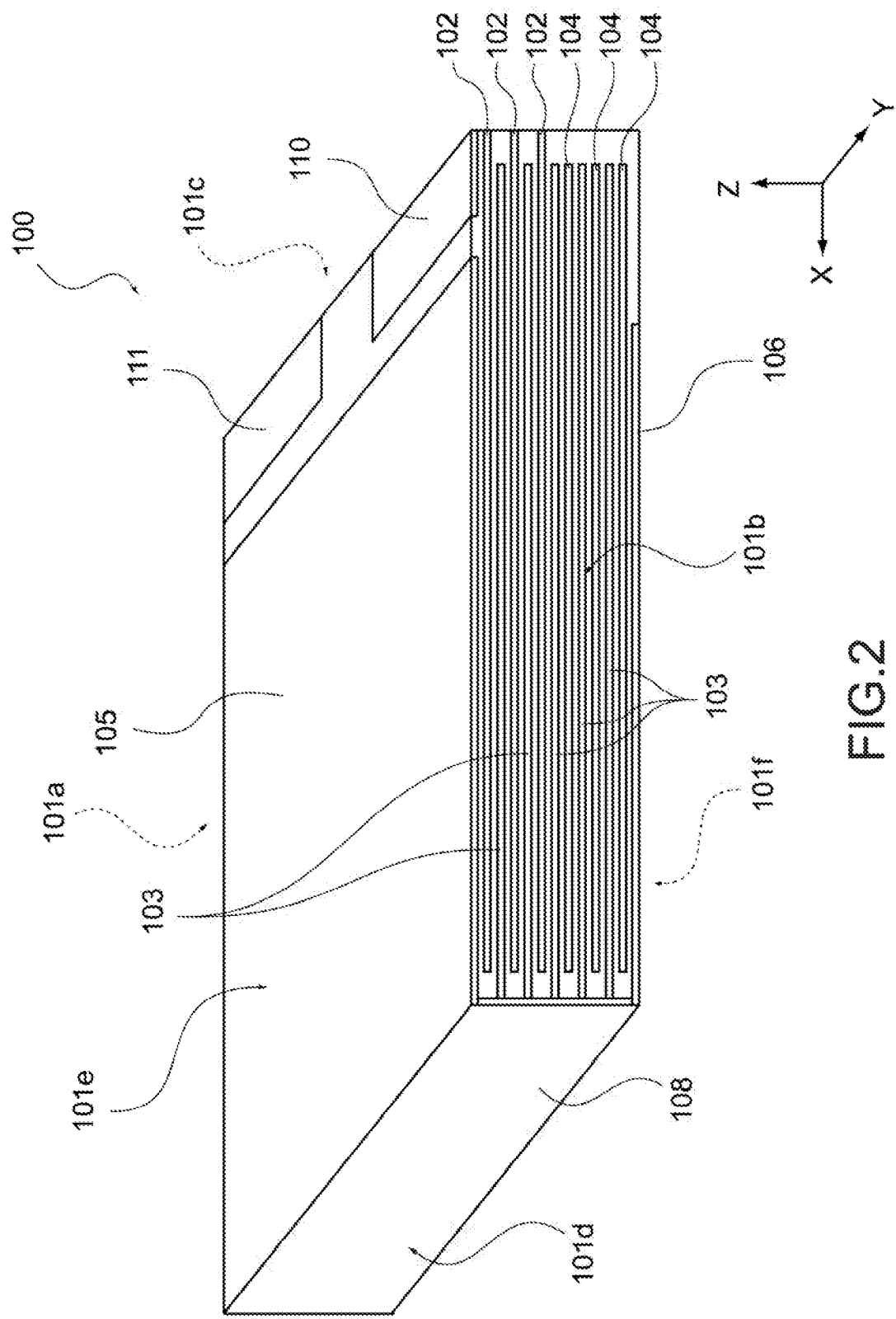
FIG. 2 is a perspective view of the multi-layer piezoelectric ceramic component 100 according to the embodiment.

FIGS. 1 and 2 are each a perspective view of a multi-layer piezoelectric ceramic component 100 according to an embodiment. FIG. 2 is a view of the opposite side from FIG. 1.

As shown in FIGS. 1 and 2, the multi-layer piezoelectric ceramic component 100 includes a piezoelectric ceramic body 101, first internal electrodes 102, second internal electrodes 103, third internal electrodes 104, a first surface electrode 105, a second surface electrode 106, a first end surface terminal electrode 107, a second end surface terminal electrode 108, a third end surface terminal electrode 109, a first surface terminal electrode 110, and a second surface terminal electrode 111.

The piezoelectric ceramic body 101 is made of a piezoelectric ceramic material. The piezoelectric ceramic body 101 includes a plurality of piezoelectric ceramic layers arranged in a Z-axis direction. The plurality of piezoelectric ceramic layers are provided in the Z-axis direction between the first internal electrodes 102 and the second internal electrodes 103 and also between the third internal electrodes 104 and the second internal electrodes 103. In this embodiment, the plurality of piezoelectric ceramic layers are also referred to as the piezoelectric ceramic body 101.

The piezoelectric ceramic body 101 may be made of, for example, lithium niobate ($LiNbO_3$), lithium tantalite ($LiTaO_3$), or lead zirconate titanate ($PbZrO_3$—$PbTiO_3$).

As shown in FIGS. 1 and 2, the piezoelectric ceramic body 101 has a cuboid shape. Assuming that the X-axis direction is a length direction, the Y-axis direction is a width direction, and the Z-axis direction is a thickness direction, the piezoelectric ceramic body 101 has such a shape that the length is larger than the width and the width is larger than the thickness (length>width>thickness).

For the surfaces of the piezoelectric ceramic body 101, surfaces facing in the width direction (Y-axis direction) are assumed as a first side surface 101a and a second side surface 101b, and surfaces facing in the length direction (X-axis direction) are assumed as a first end surface 101c and a second end surface 101d. Further, surfaces facing in the thickness direction (Z-axis direction) are assumed as an upper surface 101e and a lower surface 101f.

Figure 3:
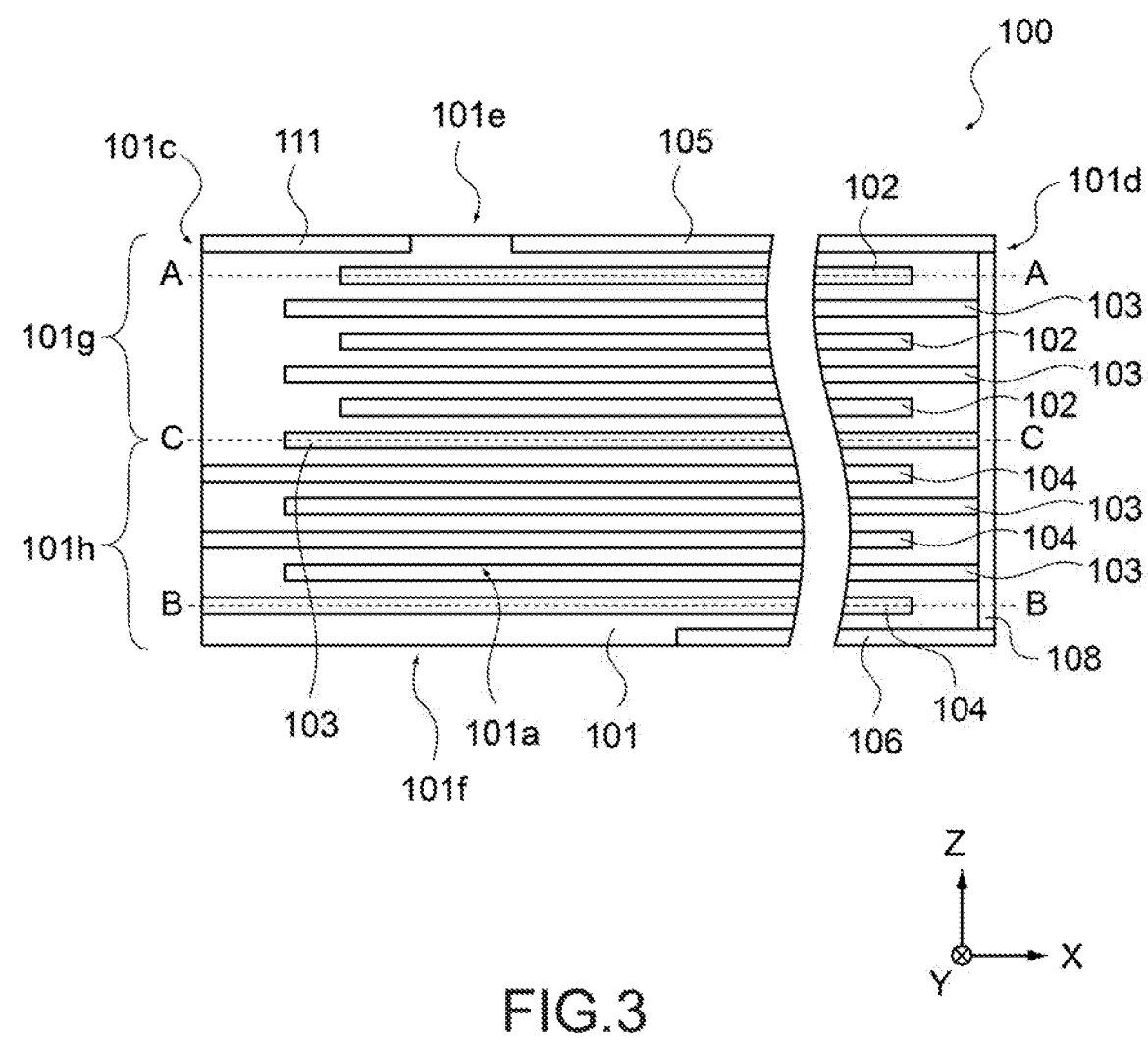
Figure 4:
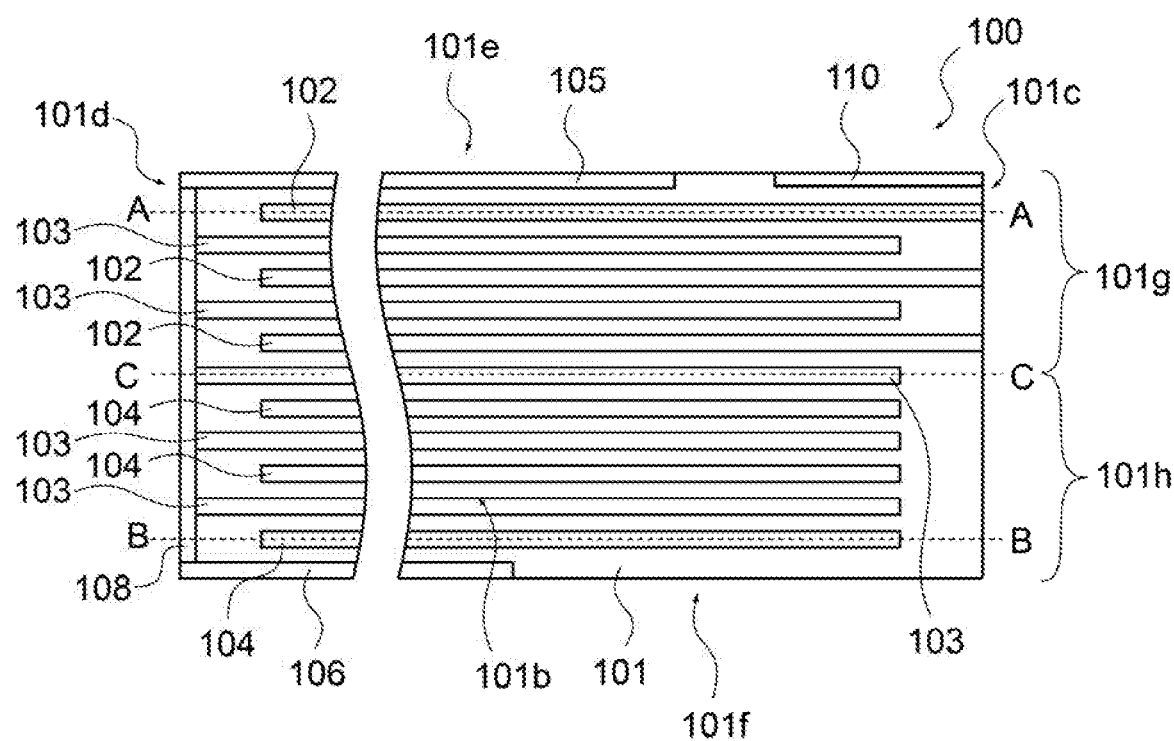
FIG. 4 is a plan view of a second side surface 101b.

FIG. 3 is a plan view of the first side surface 101a. FIG. 4 is a plan view of the second side surface 101b.

Figure 5:
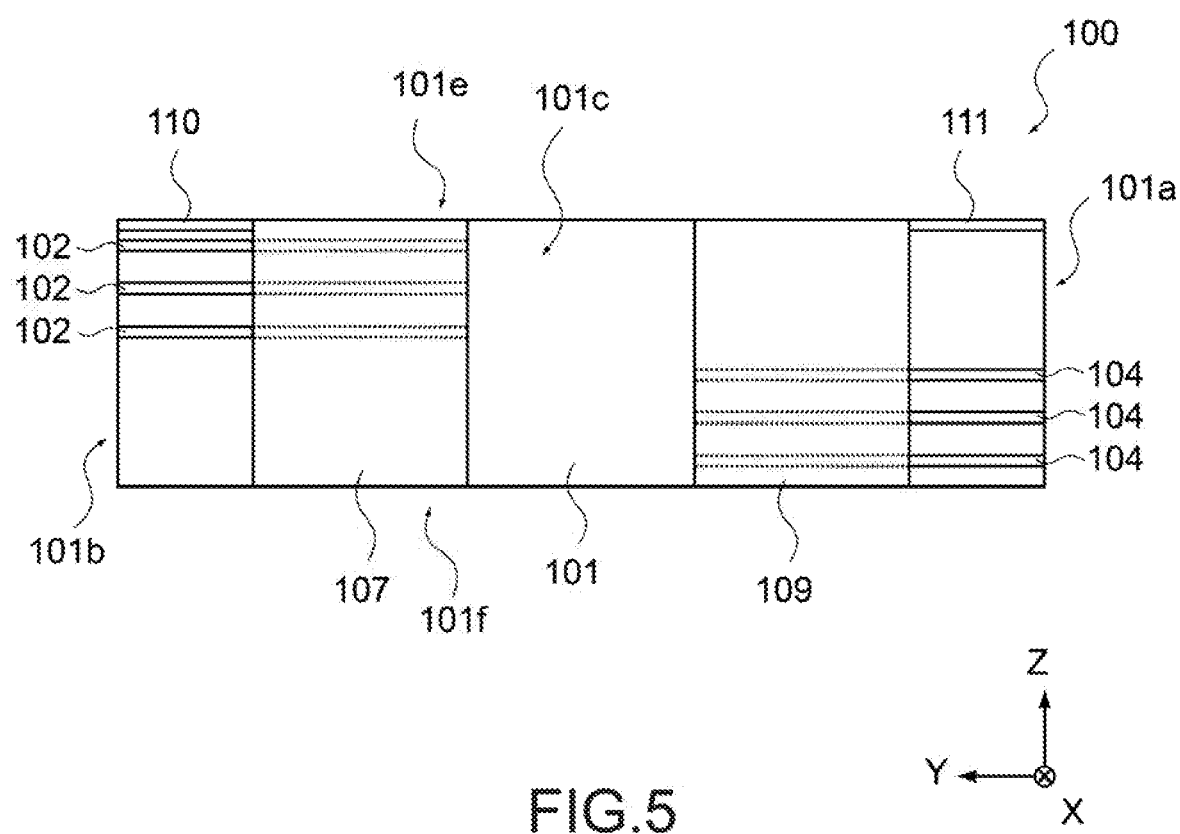
FIG. 5 is a plan view of a first end surface 101c.
Figure 6:
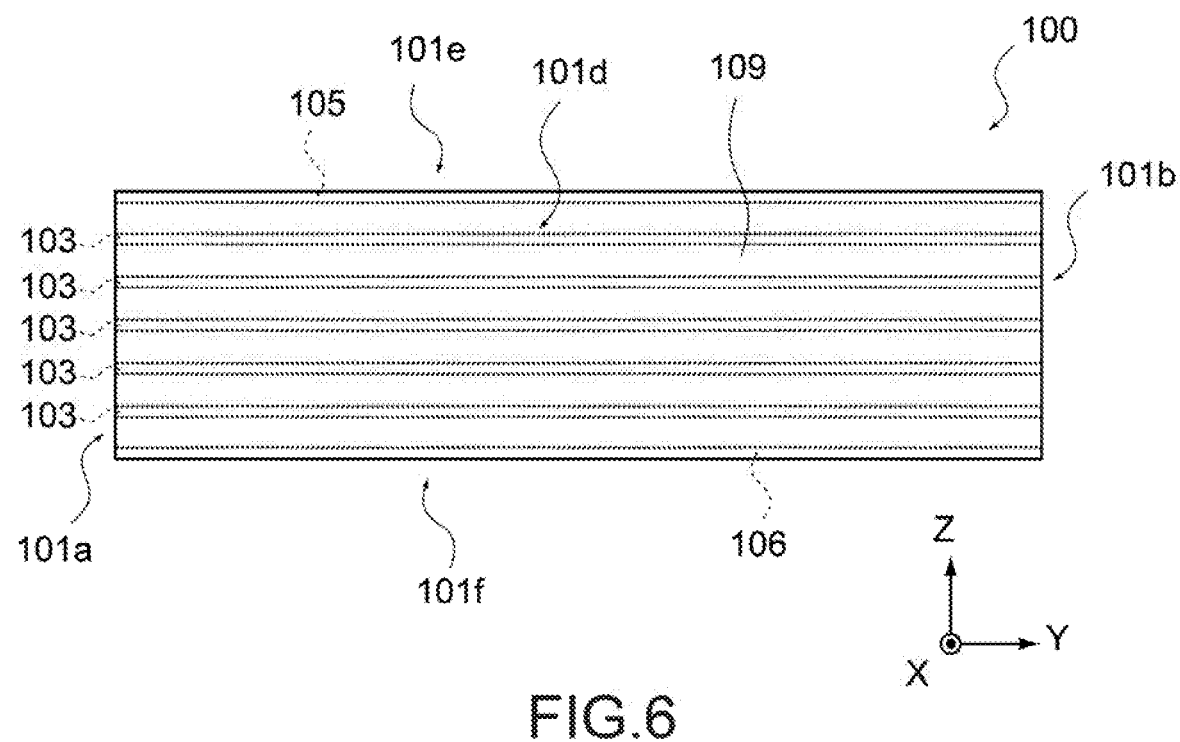
FIG. 6 is a plan view of a second end surface 101d.

FIG. 5 is a plan view of the first end surface 101c. FIG. 6 is a plan view of the second end surface 101d.

Figure 7:
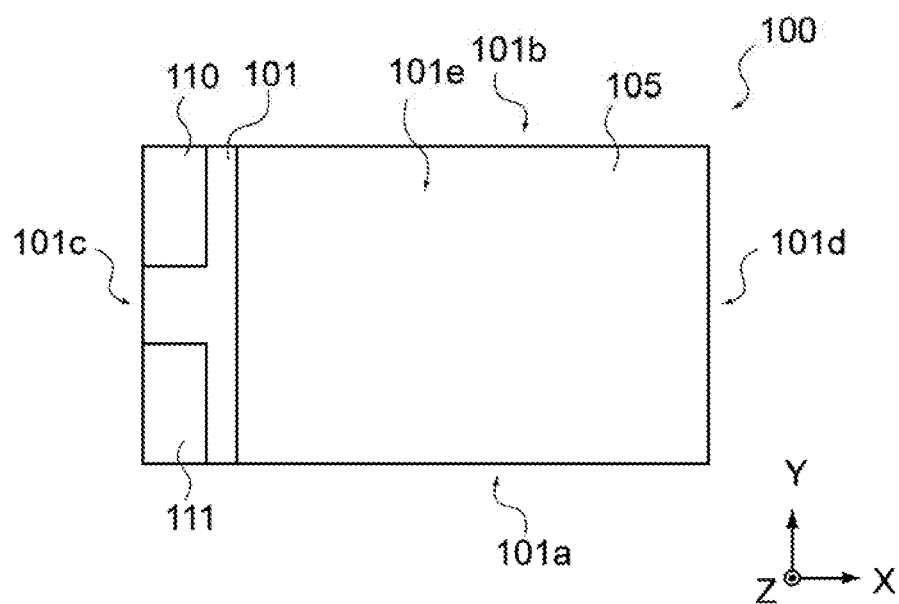
FIG. 7 is a plan view of an upper surface 101e.
Figure 8:
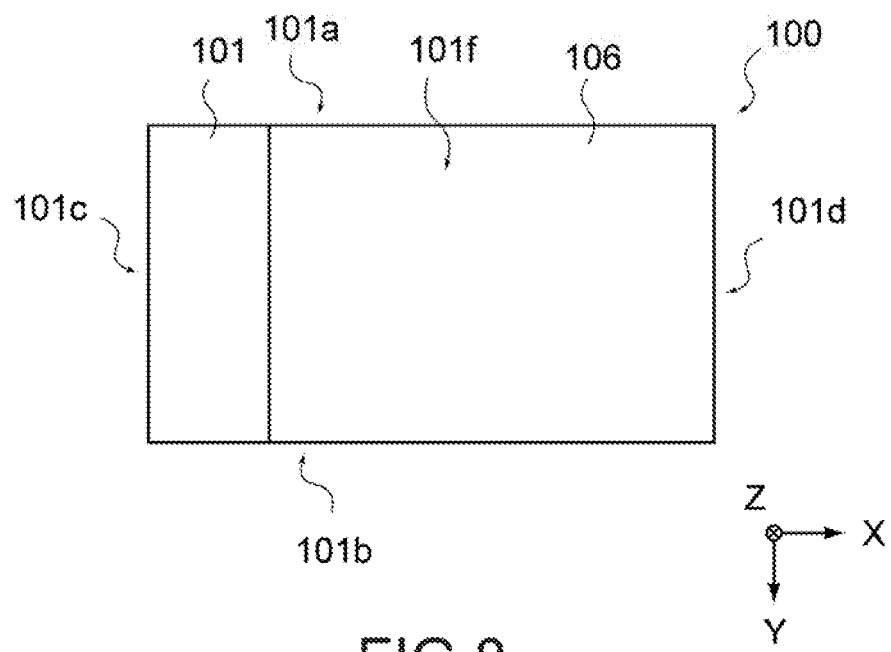
FIG. 8 is a plan view of a lower surface 101f.

FIG. 7 is a plan view of the upper surface 101e. FIG. 8 is a plan view of the lower surface 101f.

As shown in FIGS. 3 and 4, the piezoelectric ceramic body 101 includes a first region 101g on the upper surface 101e side and a second region 101h on the lower surface 101f side, which are divided in the Z-axis direction. The thickness of the first region 101g and the thickness of the second region 101h suitably have a ratio of 1:1.

Figure 9:
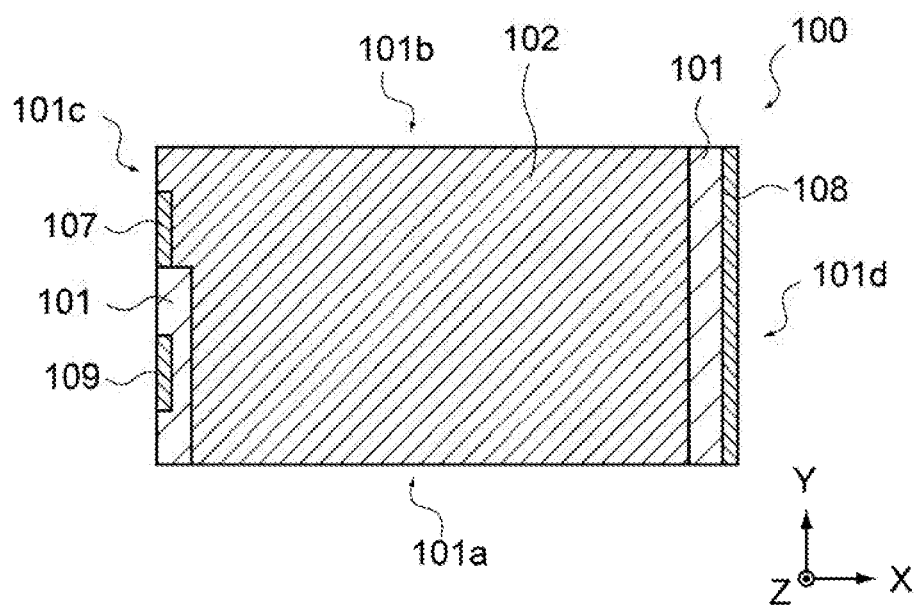
FIG. 9 is a cross-sectional view of the multi-layer piezoelectric ceramic component 100, which shows a first internal electrode 102.

The first internal electrodes 102 are formed in the first region 101g and face the second internal electrodes 103 and the first surface electrode 105 via the piezoelectric ceramic body 101 (see FIGS. 3 and 4). FIG. 9 is a cross-sectional view of the multi-layer piezoelectric ceramic component 100, which shows the first internal electrode 102, and is also a cross-sectional view taken along the line A-A of FIGS. 3 and 4. As shown in FIG. 9, the first internal electrode 102 is drawn to the first end surface 101c, partially exposed at the first end surface 101c, and electrically connected to the first end surface terminal electrode 107.

Further, the first internal electrode 102 has the same width as the width (Y-axis direction) of the piezoelectric ceramic body 101 and is exposed at the first side surface 101a and the second side surface 101b (see FIGS. 3 and 4). The number of first internal electrodes 102 is not particularly limited, and the first internal electrodes 102 may be a single layer or a plurality of layers.

Figure 10:
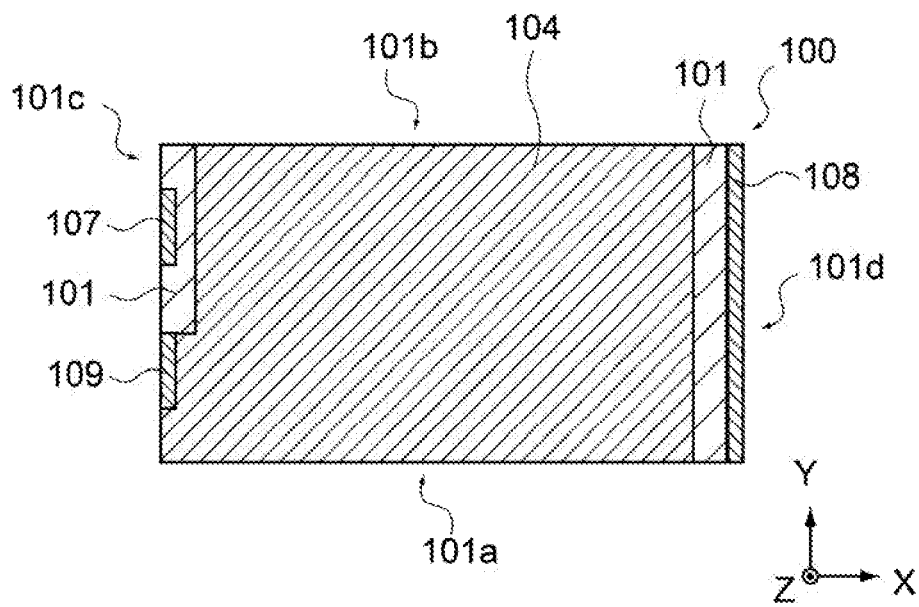
FIG. 10 is a cross-sectional view of the multi-layer piezoelectric ceramic component 100, which shows a third internal electrode 104.

The third internal electrodes 104 are formed in the second region 101h and face the second internal electrodes 103 and the second surface electrode 106 via the piezoelectric ceramic body 101 (see FIGS. 3 and 4). FIG. 10 is a cross-sectional view of the multi-layer piezoelectric ceramic component 100, which shows the third internal electrode 104, and is also a cross-sectional view taken along the line B-B of FIGS. 3 and 4. As shown in FIG. 10, the third internal electrode 104 is drawn to the first end surface 101c, partially exposed at the first end surface 101c, and electrically connected to the third end surface terminal electrode 109.

Further, the third internal electrode 104 has the same width as the width (Y-axis direction) of the piezoelectric ceramic body 101 and is exposed at the first side surface 101a and the second side surface 101b (see FIGS. 3 and 4). The number of third internal electrodes 104 is not particularly limited, and the third internal electrodes 104 may be a single layer or a plurality of layers.

The second internal electrodes 103 are formed in the first region 101g and the second region 101h.

The second internal electrodes 103 are laminated alternately with the first internal electrodes 102 in the first region 101g at predetermined distances from the respective first internal electrodes 102 in the thickness direction (Z-axis direction) and face the respective first internal electrodes 102 via the piezoelectric ceramic body 101 (see FIGS. 3 and 4).

Further, the second internal electrodes 103 are laminated alternately with the third internal electrodes 104 in the second region 101h at predetermined distances from the respective third internal electrodes 104 in the thickness direction (Z-axis direction) and face the respective third internal electrodes 104 via the piezoelectric ceramic body 101 (see FIGS. 3 and 4).

Figure 11:
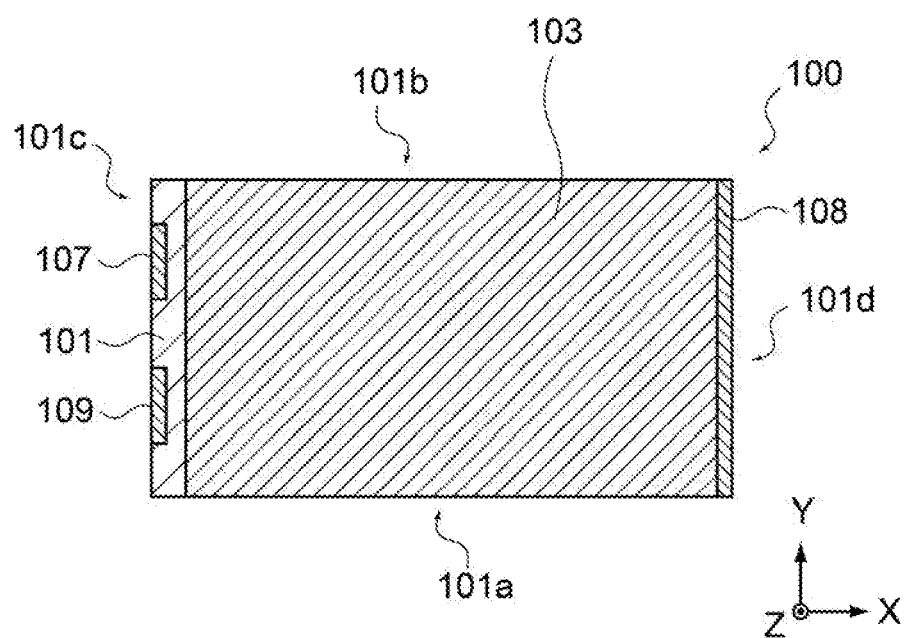
FIG. 11 is a cross-sectional view of the multi-layer piezoelectric ceramic component 100, which shows a second internal electrode 103.

FIG. 11 is a cross-sectional view of the multi-layer piezoelectric ceramic component 100, which shows the second internal electrode 103, and is also a cross-sectional view taken along the line C-C of FIGS. 3 and 4. As shown in FIG. 11, the second internal electrode 103 is drawn to the second end surface 101d, exposed at the second end surface 101d, and electrically connected to the second end surface terminal electrode 108.

Further, the second internal electrode 103 has the same width as the width (Y-axis direction) of the piezoelectric ceramic body 101 and is exposed at the first side surface 101a and the second side surface 101b (see FIGS. 3 and 4). The number of second internal electrodes 103 may be set to correspond to the number of first internal electrodes 102 and the number of third internal electrode 104.

It should be noted that at least one of the first side surface 101a, the second side surface 101b, the first end surface 101c, or the second end surface 101d includes a groove having an arithmetic average roughness (Ra) of, for example, 0.2 μm or more and 2.0 μm or less. The groove will be described later with reference to other drawings.

The first surface electrode 105 extends from the second end surface 101d side to be formed on the upper surface 101e (see FIG. 1) and is electrically connected to the second end surface terminal electrode 108. The first surface electrode 105 faces one of the first internal electrodes 102 in the Z-axis direction via the piezoelectric ceramic body 101. Further, the first surface electrode 105 is apart from and electrically insulated from the first surface terminal electrode 110 and the second surface terminal electrode 111 on the upper surface 101e (see FIG. 7).

The second surface electrode 106 extends from the second end surface 101d side to be formed on the lower surface 101f and is electrically connected to the second end surface terminal electrode 108 (see FIG. 2). The second surface electrode 106 faces one of the third internal electrodes 104 in the Z-axis direction via the piezoelectric ceramic body 101.

The first end surface terminal electrode 107 is formed on the first end surface 101c (see FIG. 1) and is electrically connected to the first internal electrodes 102. Further, the first end surface terminal electrode 107 is electrically insulated from the third internal electrodes 104 and the third end surface terminal electrode 109. The first end surface terminal electrode 107 is formed between the upper surface 101e and the lower surface 101f on the first end surface 101c and is electrically connected to the first surface terminal electrode 110.

The third end surface terminal electrode 109 is formed on the first end surface 101c (see FIG. 1) and is electrically connected to the third internal electrodes 104. Further, the third end surface terminal electrode 109 is electrically insulated from the first internal electrodes 102 and the first end surface terminal electrode 107. The third end surface terminal electrode 109 is formed between the upper surface 101e and the lower surface 101f on the first end surface 101c and is electrically connected to the second surface terminal electrode 111.

The second end surface terminal electrode 108 is formed on the second end surface 101d (see FIG. 2) and is electrically connected to the second internal electrodes 103. Further, the second end surface terminal electrode 108 is formed between the upper surface 101e and the lower surface 101f on the second end surface 101d and is electrically connected to the first surface electrode 105 and the second surface electrode 106.

The first surface terminal electrode 110 is formed on the upper surface 101e (see FIG. 1). The first surface terminal electrode 110 is electrically connected to the first end surface terminal electrode 107 and is electrically insulated from the second surface terminal electrode 111 and the first surface electrode 105.

The second surface terminal electrode 111 is formed on the upper surface 101e (see FIG. 1). The second surface terminal electrode 111 is electrically connected to the third end surface terminal electrode 109 and is electrically insulated from the first surface terminal electrode 110 and the first surface electrode 105.

The first internal electrodes 102, the second internal electrodes 103, the third internal electrodes 104, the first surface electrode 105, the second surface electrode 106, the first end surface terminal electrode 107, the second end surface terminal electrode 108, the third end surface terminal electrode 109, the first surface terminal electrode 110, and the second surface terminal electrode 111 are each made of an electrically conductive material. The electrically conductive material may be any one of, for example, Ag, Ag/Pd, Pd, Cu, and Ni.

As described above, the first internal electrodes 102, the second internal electrodes 103, and the third internal electrodes 104 are formed in the piezoelectric ceramic body 101, the first internal electrodes 102 and the second internal electrodes 103 face each other via the piezoelectric ceramic body 101, and the third internal electrodes 104 and the second internal electrodes 103 face each other via the piezoelectric ceramic body 101. The first internal electrodes 102, the second internal electrodes 103, and the third internal electrodes 104 are insulated from one another.

Groove

Figure 12A:
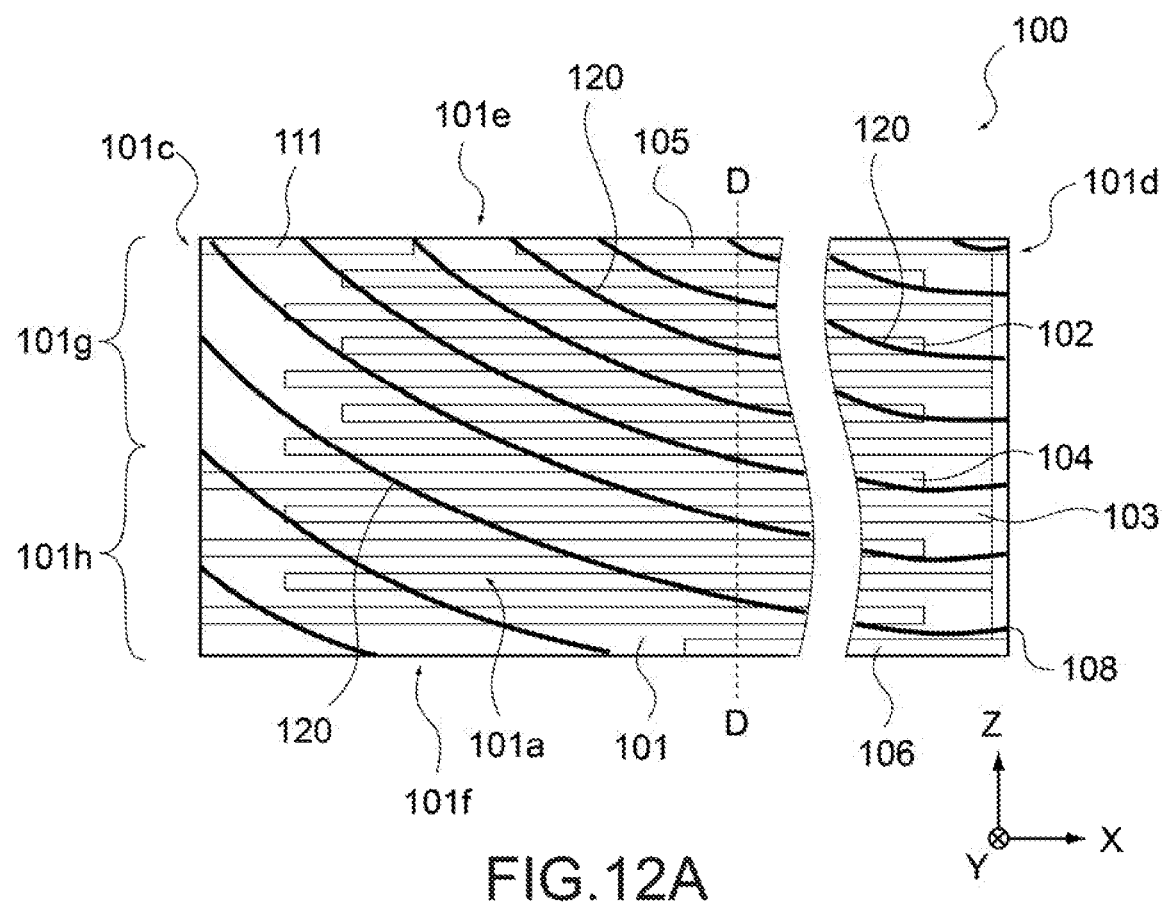
FIG. 12A is a schematic view of the first side surface 101a including grooves 120.
Figures 12B, 12C:
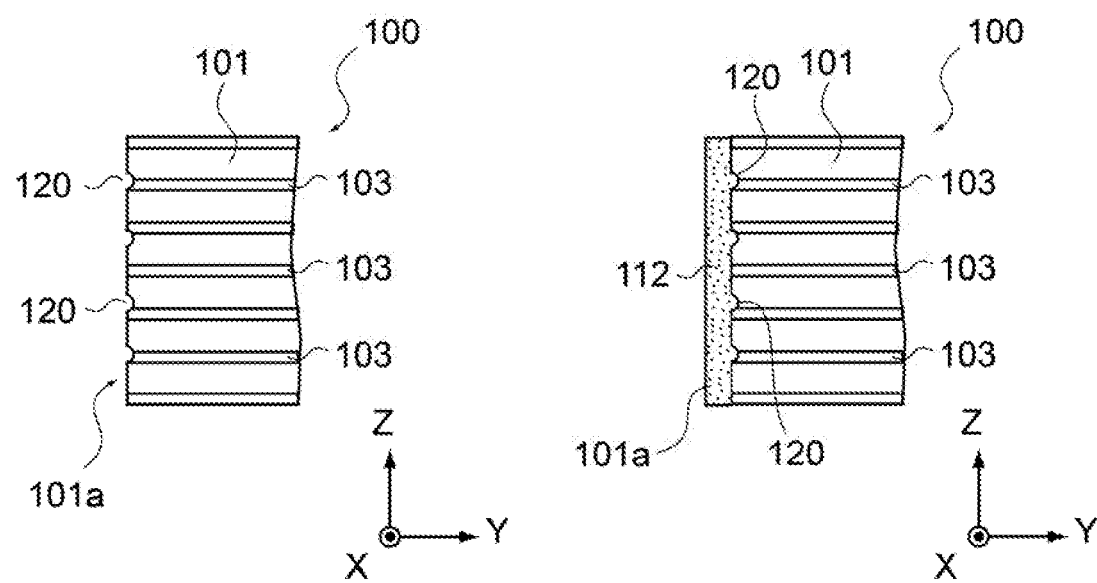

FIG. 12A is a schematic view of the first side surface 101a including grooves 120. FIG. 12B shows a part of a cut surface taken along the line D-D of FIG. 12A. The grooves 120 may be not only provided to the first side surface 101a, but also provided to at least one of the first side surface 101a, the second side surface 101b, the first end surface 101c, or the second end surface 101d.

The first side surface 101a according to this embodiment is a surface at which the piezoelectric ceramic body 101, the first internal electrodes 102, the second internal electrodes 103, and the third internal electrodes 104 are exposed and to which the grooves 120 are provided. Each of the grooves 120 extends in non-parallel with the X-axis direction (length direction). For example, the groove 120 is configured to be arc-like on the X-Z axis plane. The groove 120 may continuously extend or may be intermittent. Further, the groove 120 may be linear. The number of grooves 120 may be set to be denser or coarser than that of the example shown in the figures.

The grooves 120 are formed, for example, when the first side surface 101a is cut with a disc-like dicing blade. For example, when diamond abrasive grains or the like included in the dicing blade scratch the first side surface 101a, the grooves 120 are formed. The grooves 120 are so-called dicing traces. Surface roughness of the first side surface 101a on which the grooves 120 are formed is controlled by adjusting a grain size of the diamond abrasive grains.

In such a manner, in this embodiment, at least one of the first side surface 101a, the second side surface 101b, the first end surface 101c, or the second end surface 101d includes the grooves 120.

FIG. 12C shows an example in which an insulating film 112 is formed on the first side surface 101a.

From the viewpoint of insulation properties and moisture resistance between the electrodes, the insulating film 112 may be provided to the first side surface 101a at which the first internal electrodes 102, the second internal electrodes 103, and the third internal electrodes 104 are exposed.

In such a case, since the first side surface 101a includes the grooves 120, adhesion properties between the insulating film 112 and the first side surface 101a are largely improved by an anchoring effect. Further, in a case where the dicing traces are used as the grooves 120, the step of polishing the first side surface 101a, the second side surface 101b, the first end surface 101c, and the second end surface 101d can be omitted, and increase in cost of the multi-layer piezoelectric ceramic component 100 can be suppressed.

The size of the multi-layer piezoelectric ceramic component 100 is not particularly limited, but assuming that the length (X-axis direction) is L and the width (Y-axis direction) is W, it is suitable that L/W is approximately 16 to 50. Further, it is suitable that the thickness (Z-axis direction) is approximately 0.5 mm to 1.5 mm.

Operation of Multi-layer Piezoelectric Ceramic Component

In the multi-layer piezoelectric ceramic component 100, a voltage can be independently applied between the first internal electrodes 102 and the second internal electrodes 103 and between the third internal electrodes 104 and the second internal electrodes 103.

When a voltage is applied between the first internal electrodes 102 and the second internal electrodes 103, an inverse piezoelectric effect occurs in the piezoelectric ceramic body 101 between the first internal electrodes 102 and the second internal electrodes 103 and causes deformation (expansion and contraction) in the X-axis direction in the first region 101g. Further, when a voltage is applied between the third internal electrodes 104 and the second internal electrodes 103, an inverse piezoelectric effect occurs in the piezoelectric ceramic body 101 between the third internal electrodes 104 and the second internal electrodes 103 and causes deformation (expansion and contraction) in the X-axis direction in the second region 101h.

In such a manner, in the multi-layer piezoelectric ceramic component 100, the deformation in the first region 101g and the deformation in the second region 101h can be independently controlled. The first region 101g and the second region 101h are separately deformed in the X-axis direction, and thus the multi-layer piezoelectric ceramic component 100 can be deformed (bent) in the Z-axis direction.

Figure 13A:
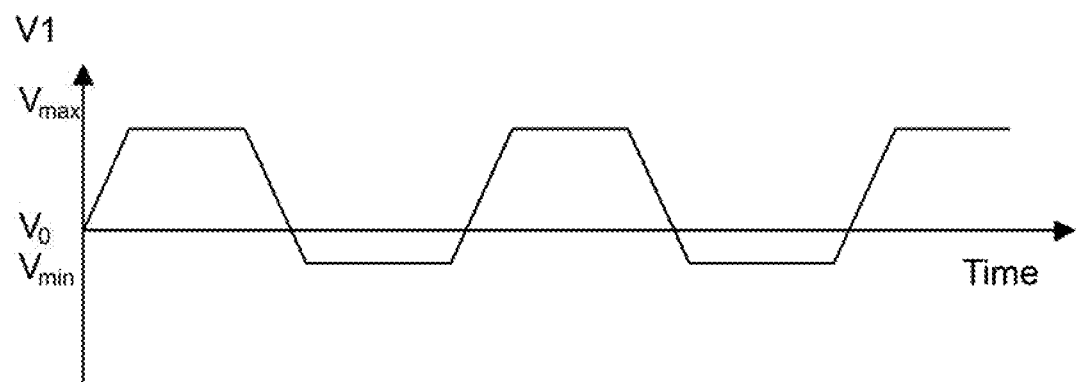
FIGS. 13A and 13B show examples of voltage waveforms applied to the multi-layer piezoelectric ceramic component 100.
Figure 13B:
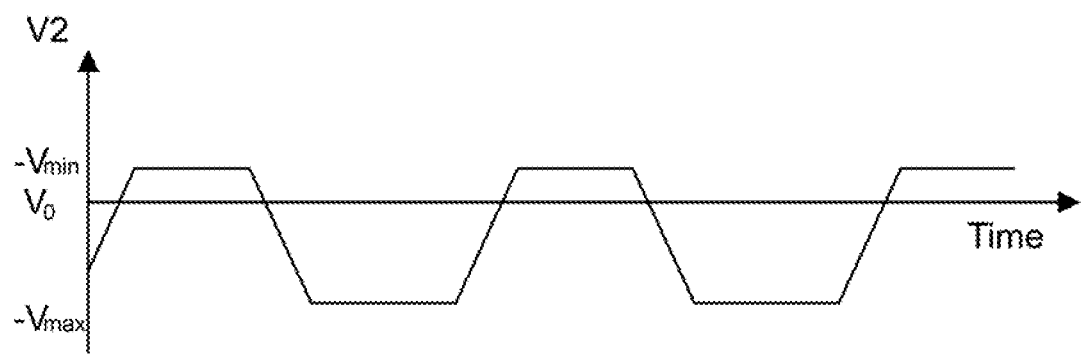

FIGS. 13A and 13B show examples of voltage waveforms applied to the multi-layer piezoelectric ceramic component 100. FIG. 13A shows a waveform of a voltage (V1) applied between the first internal electrodes 102 and the second internal electrodes 103. FIG. 13B shows a waveform of a voltage (V2) applied between the third internal electrodes 104 and the second internal electrodes 103. It should be noted that $V_0$ represents a potential of the second internal electrodes 103. As shown in FIGS. 13A and 13B, when the voltage V1 and the voltage V2 are set as reverse bias voltages in the same phase, one of the first region 101g and the second region 101h can be expanded, and the other one of the first region 101g and the second region 101h can be contracted.

In particular, even if such an operation continues over a long period of time, since the insulating film 112 tightly adheres to the first side surface 101a, the second side surface 101b, the first end surface 101c, and the second end surface 101d, the insulating film 112 is less likely to be peeled off from those side surfaces and end surfaces in the multi-layer piezoelectric ceramic component 100.

It should be noted that when the thickness of the first region 101g and the thickness of the second region 101h have a ratio of 1:1, the first region 101g and the second region 101h are symmetrical with each other in terms of the amount of deformation, which is suitable. Further, the waveforms of the voltage V1 and the voltage V2 are not limited to those shown in FIGS. 13A and 13B and may be each a sine wave or a triangle wave.

Regarding Structure Without Side Margin

As described above, the multi-layer piezoelectric ceramic component 100 has a structure in which the first internal electrodes 102, the second internal electrodes 103, and the third internal electrodes 104 are exposed at the first side surface 101a and the second side surface 101b.

Figure 14:
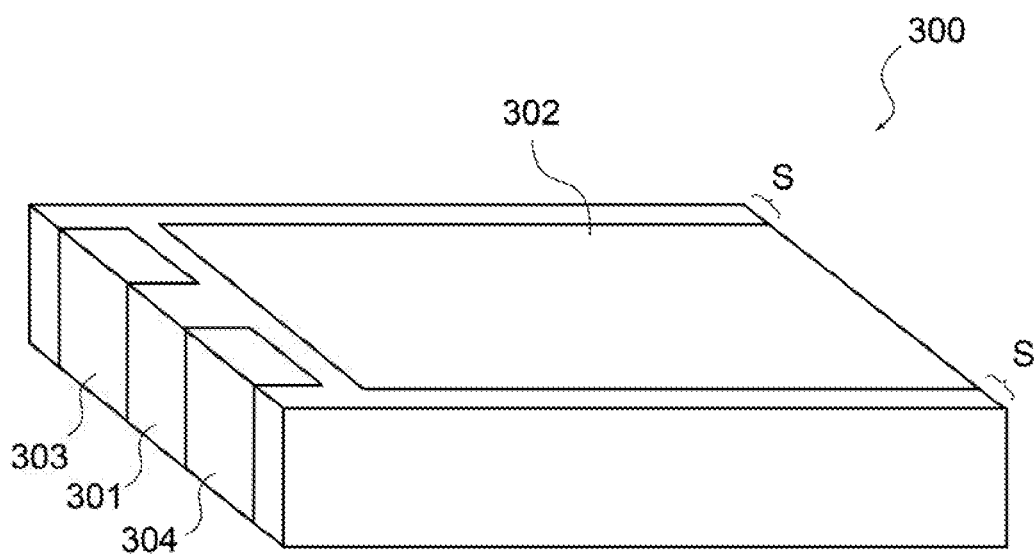
FIG. 14 is a perspective view of a multi-layer piezoelectric ceramic component 300 according to a comparative example.

FIG. 14 is a perspective view of a multi-layer piezoelectric ceramic component 300 according to a comparative example.

As shown in FIG. 14, the multi-layer piezoelectric ceramic component 300 includes a piezoelectric ceramic body 301, a surface electrode 302, a first terminal electrode 303, and a second terminal electrode 304. Further, the multi-layer piezoelectric ceramic component 300 includes internal electrodes (not shown) corresponding to the first internal electrodes 102, the second internal electrodes 103, and the third internal electrodes 104.

In the multi-layer piezoelectric ceramic component 300, the internal electrodes are not exposed at the side surfaces and are embedded in the piezoelectric ceramic body 301. As shown in FIG. 14, side margins S made of a piezoelectric material are each provided on the side surface side of the internal electrodes.

The side margins S are not sandwiched by the internal electrodes in the Z-axis direction when the multi-layer piezoelectric ceramic component 300 is driven. Thus, the side margins S act as restraint portions that suppress the displacement of the multi-layer piezoelectric ceramic component 300. This reduces displacement performance of the multi-layer piezoelectric ceramic component 300.

To the contrary, in the multi-layer piezoelectric ceramic component 100, each width of the first internal electrodes 102, the second internal electrodes 103, and the third internal electrodes 104 is equal to a distance between the pair of side surfaces 101a and 101b. In other words, the first internal electrodes 102, the second internal electrodes 103, and the third internal electrodes 104 are exposed at the first side surface 101a and the second side surface 101b in the multi-layer piezoelectric ceramic component 100, and the multi-layer piezoelectric ceramic component 100 does not include side margins. Thus, it is possible to generate large displacement without receiving a restraint effect provided by the side margins and to prevent the displacement performance from being reduced.

Regarding Insulating Film

Figure 15:
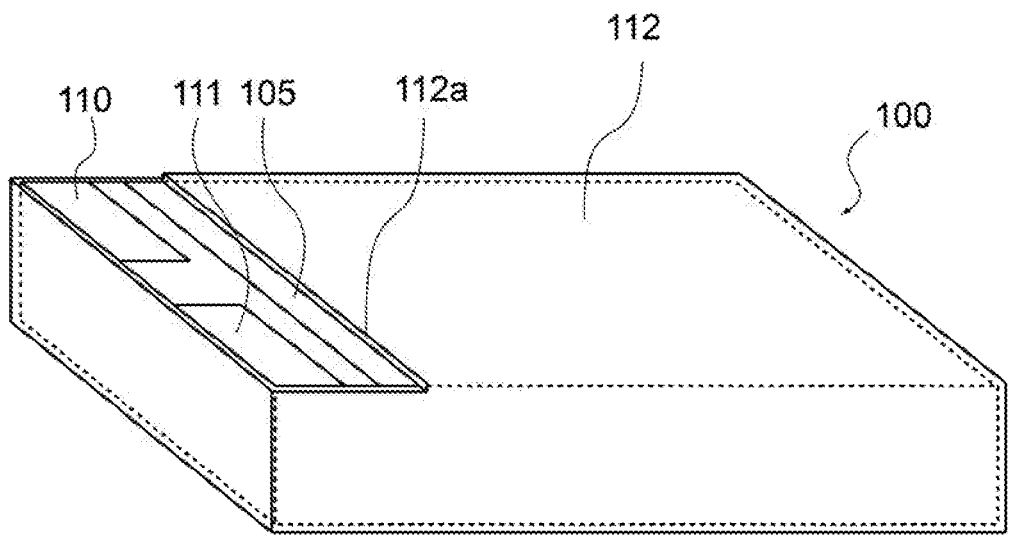
FIG. 15 is a perspective view of the multi-layer piezoelectric ceramic component 100 including the insulating film 112.

FIG. 15 is a perspective view of the multi-layer piezoelectric ceramic component 100 including the insulating film 112.

The insulating film 112 described above may cover not only the first side surface 101a, the second side surface 101b, the first end surface 101c, and the second end surface 101d but also the outer periphery of the multi-layer piezoelectric ceramic component 100. Here, in the X-axis direction, the length of the insulating film 112 formed on the upper surface 101e is equal to the length of the second surface electrode 106.

In other words, the insulating film 112 includes an opening 112a from which the first surface terminal electrode 110, the second surface terminal electrode 111, and the first surface electrode 105 are partially exposed. In the multi-layer piezoelectric ceramic component 100, electrical connection (three-terminal connection) to the first surface terminal electrode 110, the second surface terminal electrode 111, and the first surface electrode 105 via the single opening 112a can be established. This makes a wiring structure compact.

The range covered with the insulating film 112 is not limited to the range shown in FIG. 15 and only needs to cover at least the first side surface 101a and the second side surface 101b at which the first internal electrodes 102, the second internal electrodes 103, and the third internal electrodes 104 are exposed.

It should be noted that the insulating film 112 is made of a material different from the material of the piezoelectric ceramic body 101, and a soft material can be used therefor. Thus, a restraint effect provided by the insulating film 112 can be made significantly small. In other words, in the multi-layer piezoelectric ceramic component 100, the displacement performance is prevented from being reduced.

The material of the insulating film 112 is not particularly limited as long as the material is an insulating material. For example, examples of the material of the insulating film 112 include an organic resin of polyimide, polypropylene, acrylic, epoxy, or the like, or an inorganic insulating film of $Si_3N_4$, $SiO_2$, or the like. In particular, when an organic resin is used as the insulating film 112, the surface roughness of the side surfaces and the end surfaces is made larger than that when the inorganic insulating film is used, so that the adhesion of the insulating film 112 tends to be improved.

Regarding Production Method

A production method for the multi-layer piezoelectric ceramic component 100 will be described.

Figure 16A:
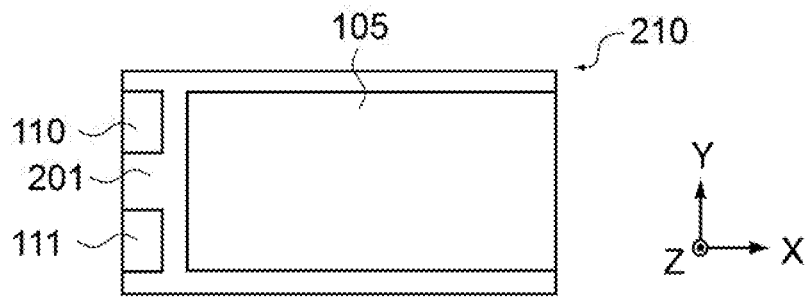
FIGS. 16A to 16E are each a schematic view of a sheet member.
Figure 16B:
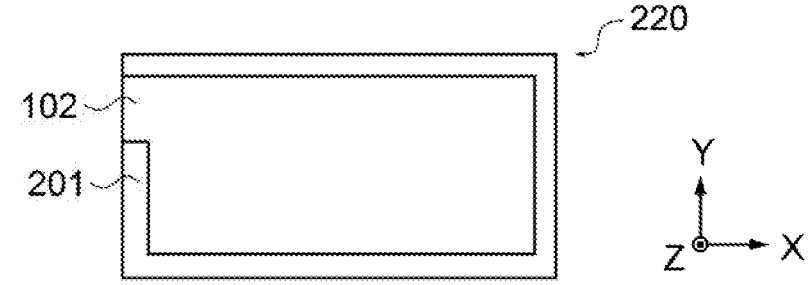

The multi-layer piezoelectric ceramic component 100 can be produced by laminating sheet members. FIGS. 16A to 16E are schematic views of respective sheet members. FIG. 16A shows a sheet member 210 including the first surface electrode 105, the first surface terminal electrode 110, the second surface terminal electrode 111, and a piezoelectric ceramic body 201. FIG. 16B shows a sheet member 220 including the first internal electrode 102 and the piezoelectric ceramic body 201.

Figure 16C:
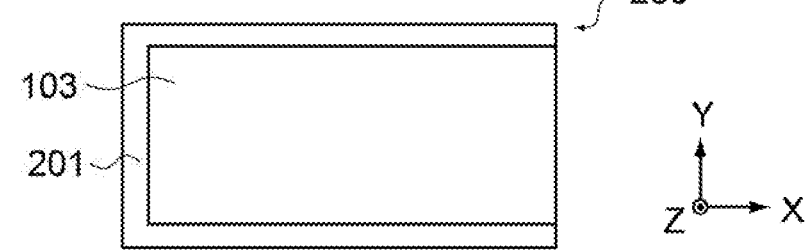
Figure 16D:
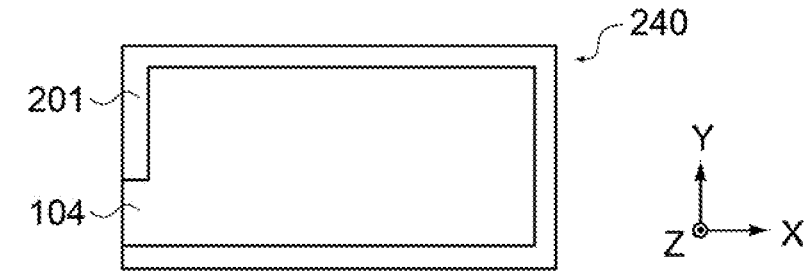
Figure 16E:
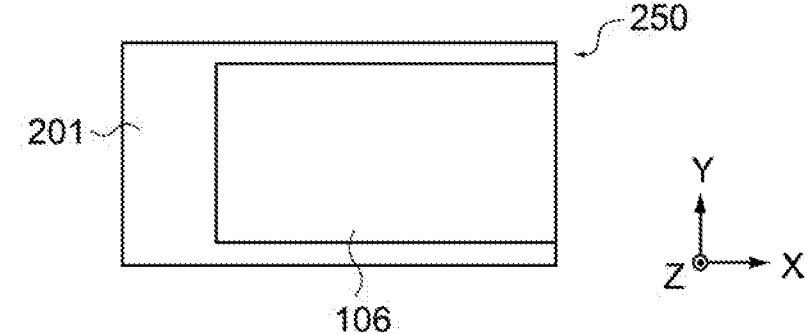

FIG. 16C shows a sheet member 230 including the second internal electrode 103 and the piezoelectric ceramic body 201. FIG. 16D shows a sheet member 240 including the third internal electrode 104 and the piezoelectric ceramic body 201. FIG. 16E shows a sheet member 250 including the second surface electrode 106 and the piezoelectric ceramic body 201.

First, a sheet member including only a piezoelectric ceramic body (hereinafter, referred to as piezoelectric sheet member) is laminated on the sheet member 250, and thereon, the sheet member 240, a piezoelectric sheet member, and the sheet member 230 are laminated in this order. Moreover, the sheet members 240 and the sheet members 230 are alternately laminated via piezoelectric sheet members.

Subsequently, the sheet members 220 and the sheet members 230 are alternately laminated via piezoelectric sheet members, and thereon, a piezoelectric sheet member and the sheet member 210 are laminated in this order. Subsequently, this laminate is pressure-bonded, and a binder is removed by heating or the like.

Subsequently, sintering is performed. At this stage, each internal electrode is embedded in the piezoelectric ceramic body 201, and side margins are formed. Subsequently, by heat treatment, the first end surface terminal electrode 107 and the third end surface terminal electrode 109 are formed on the first end surface 101c, and the second end surface terminal electrode 108 is formed on the second end surface 101d.

Subsequently, the side margins are cut by dicing and removed. Accordingly, the grooves 120 are formed in at least one of the first side surface 101a, the second side surface 101b, the first end surface 101c, or the second end surface 101d. It should be noted that the surface roughness of each of the first side surface 101a, the second side surface 101b, the first end surface 101c, and the second end surface 101d may be appropriately adjusted to be predetermined roughness by using a polishing technique.

Accordingly, the piezoelectric ceramic body 101 is formed from the piezoelectric ceramic bodies 201. When the side margins are cut, the first side surface 101a and the second side surface 101b are formed, and the first internal electrodes 102, the second internal electrodes 103, and the third internal electrodes 104 are exposed at the first side surface 101a and the second side surface 101b (see FIG. 1).

Subsequently, the insulating film 112 including the opening 112a is formed (see FIG. 15). The insulating film 112 can be formed by a method such as mist deposition, sputtering, or dipping. Subsequently, the first surface terminal electrode 110 and the second surface terminal electrode 111 are electrically connected, and a DC voltage is applied. This causes a polarizing process and activates the piezoelectric ceramic body 101.

The multi-layer piezoelectric ceramic component 100 can be produced as described above. It should be noted that the production method for the multi-layer piezoelectric ceramic component 100 is not limited to the method described herein.

Regarding Piezoelectric Device

Figure 17:
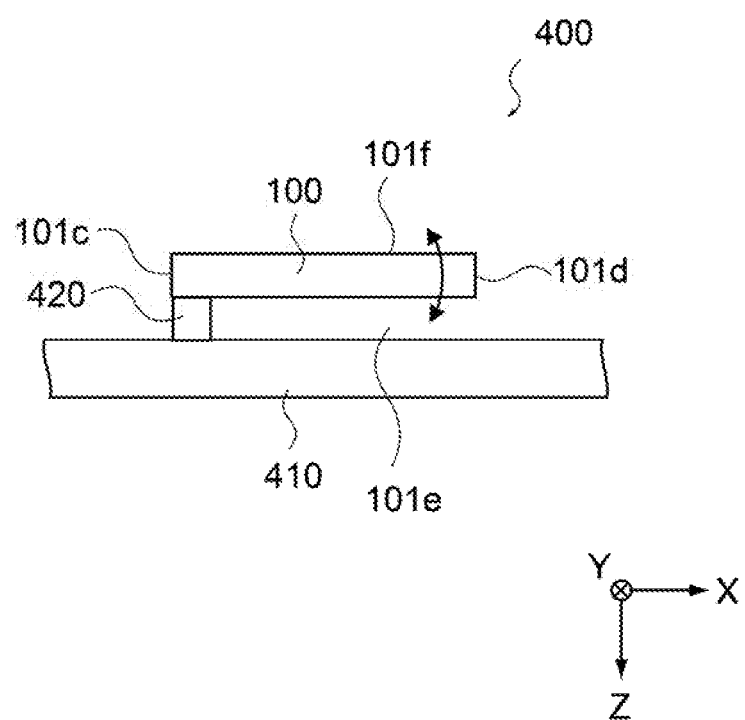
FIG. 17 is a schematic view of a piezoelectric device 400 including the multi-layer piezoelectric ceramic component 100.

The multi-layer piezoelectric ceramic component 100 can be mounted to a vibration member to configure a piezoelectric device. FIG. 17 is a schematic view of a piezoelectric device 400 including the multi-layer piezoelectric ceramic component 100. As shown in FIG. 17, the piezoelectric device 400 includes the multi-layer piezoelectric ceramic component 100, a vibration member 410, and a joint 420.

The vibration member 410 is a metal plate or a glass panel of a display and is not particularly limited. The joint 420 is made of a resin or the like and joins the multi-layer piezoelectric ceramic component 100 to the vibration member 410.

In the multi-layer piezoelectric ceramic component 100, a region of the upper surface 101e on the first end surface 101c side is joined to the joint 420. Wiring (not shown) is electrically connected to the first surface terminal electrode 110, the second surface terminal electrode 111, and the first surface electrode 105.

When a voltage is applied to each electrode, as described above, the multi-layer piezoelectric ceramic component 100 is deformed in the Z-axis direction (arrow in FIG. 17). This allows the vibration member 410 to vibrate. It should be noted that the method of mounting the multi-layer piezoelectric ceramic component 100 is not limited to that described herein. For example, the entire upper surface 101e may be joined to the joint 420.

Hereinabove, the embodiment of the present disclosure has been described, but the present disclosure is not limited to the embodiment described above and can be variously modified as a matter of course. Each embodiment is not limited to be an independent embodiment, and some embodiments can be combined as long as it is technically possible.

What is claimed is:

1. A multi-layer piezoelectric ceramic component, comprising:
a piezoelectric ceramic body having a cuboid shape having an upper surface and a lower surface facing each other in a thickness direction, a first end surface and a second end surface facing each other in a length direction, and a pair of side surfaces facing each other in a width direction;
first internal electrodes that are formed in the piezoelectric ceramic body and are drawn to the first end surface;
second internal electrodes that are formed in the piezoelectric ceramic body and are drawn to the second end surface, the second internal electrodes being laminated alternately with the first internal electrodes at predetermined distances from the respective first internal electrodes in the thickness direction;
a first terminal electrode that is formed on the first end surface and is electrically connected to the first internal electrodes; and
a second terminal electrode that is formed on the second end surface and is electrically connected to the second internal electrodes,
the first internal electrodes and the second internal electrodes each having a width equal to a distance between the pair of side surfaces,
the piezoelectric ceramic body having a length in the length direction being larger than a width in the width direction and the width being larger than a thickness in the thickness direction, and
at least one of the pair of side surfaces including a groove extending thereon in non-parallel with the length direction.

2. The multi-layer piezoelectric ceramic component according to claim 1, further comprising:
third internal electrodes that are formed in the piezoelectric ceramic body and are drawn to a position of the first end surface, the position being different from a position to which the first internal electrodes are drawn, the third internal electrodes being laminated alternately with the second internal electrodes at predetermined distances from the respective second internal electrodes in the thickness direction; and
a third terminal electrode that is electrically connected to the third internal electrodes at a position of the first end surface, the position being different from the position to which the first internal electrodes are drawn, wherein
the third internal electrodes each have a width equal to a distance between the pair of side surfaces.

3. The multi-layer piezoelectric ceramic component according to claim 1, wherein
the pair of side surfaces are covered with an insulating film made of an insulator different from the piezoelectric ceramic body.

4. A piezoelectric device, comprising:
a vibration member; and
a multi-layer piezoelectric ceramic component mounted to the vibration member,
the multi-layer piezoelectric ceramic component including
a piezoelectric ceramic body having a cuboid shape having an upper surface and a lower surface facing each other in a thickness direction, a first end surface and a second end surface facing each other in a length direction, and a pair of side surfaces facing each other in a width direction,
first internal electrodes that are formed in the piezoelectric ceramic body and are drawn to the first end surface,
second internal electrodes that are formed in the piezoelectric ceramic body and are drawn to the second end surface, the second internal electrodes being laminated alternately with the first internal electrodes at predetermined distances from the respective first internal electrodes in the thickness direction,
a first terminal electrode that is formed on the first end surface and is electrically connected to the first internal electrodes, and
a second terminal electrode that is formed on the second end surface and is electrically connected to the second internal electrodes, the first internal electrodes and the second internal electrodes each having a width equal to a distance between the pair of side surfaces, the piezoelectric ceramic body having a length in the length direction being larger than a width in the width direction and the width being larger than a thickness in the thickness direction, and at least one of the pair of side surfaces including a groove extending thereon in non-parallel with the length direction.

* * * * *